Figure 1:
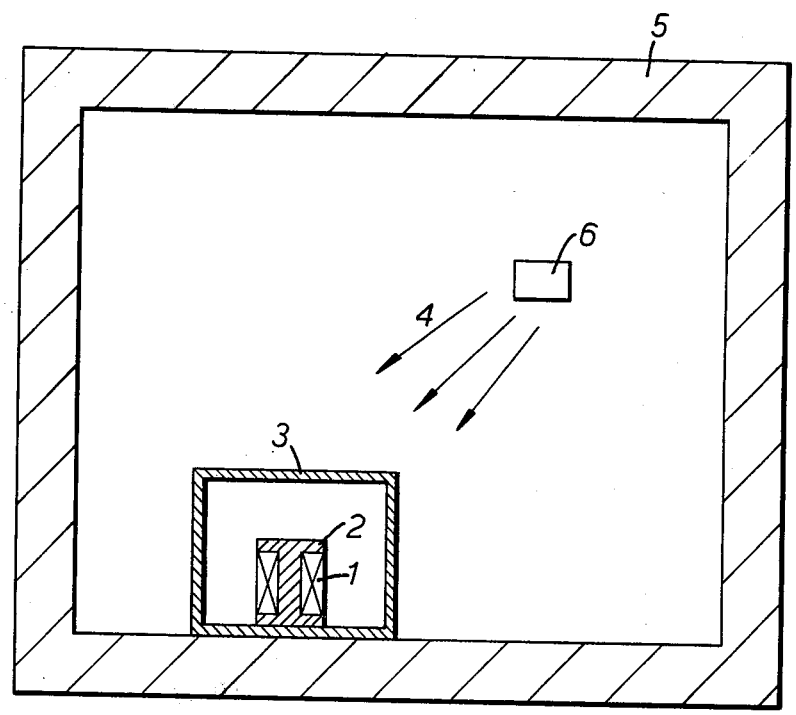

United States Patent [19]
Pantelis

[11] 4,239,608

[45] Dec. 16, 1980

[54] METHOD FOR PRODUCING PIEZOELECTRIC POLYMERIC MATERIAL

[75] Inventor: Philippos Pantelis, Ipswich, England

[73] Assignee: Post Office, London, England

[21] Appl. No.: 927,587

[22] Filed: Jul. 19, 1978

[30] Foreign Application Priority Data

Jul. 19, 1977 [GB] United Kingdom ............... 30237/77

[51] Int. Cl.$^2$ ............................. B01J 1/10; C08F 8/00
[52] U.S. Cl. ........................... 204/159.17; 204/159.14; 204/158 HE; 252/62.9
[58] Field of Search ................ 252/62.9; 204/158 HE, 204/159.14, 159.17

[56] References Cited

U.S. PATENT DOCUMENTS

| | | | |
|---|---|---|---|
| 3,330,748 | 7/1967 | Lawton | 204/158 HE |
| 3,644,605 | 2/1972 | Sessler et al. | 204/158 HE |
| 3,833,503 | 9/1974 | Murayama et al. | 252/62.9 |

FOREIGN PATENT DOCUMENTS

| | | | |
|---|---|---|---|
| 48-55273 | 5/1973 | Japan | 252/62.9 |
| 48-39998 | 6/1973 | Japan | 252/62.9 |

OTHER PUBLICATIONS

Oikawa et al., "Chem. Abstracts," vol. 81, 1974, 83542z.

*Primary Examiner*—Jack Cooper
*Attorney, Agent, or Firm*—Mason, Fenwick & Lawrence

[57] ABSTRACT

A method of enhancing the piezoelectric properties of a polymeric material exhibiting such properties includes the step of exposing the material to a quantity of $\gamma$ radiation lying within the range of from 1 Mrad to 200 Mrads. The material is subsequently poled. Best results are obtained when the material is exposed to between 1 Mrad and 100 Mrads of radiation. The material treated may be polyvinylidene fluoride.

7 Claims, 1 Drawing Figure

METHOD FOR PRODUCING PIEZOELECTRIC POLYMERIC MATERIAL

This invention relates to piezoelectric materials and to methods for producing such materials. The invention has particular reference to polymeric materials exhibiting piezoelectric properties and to the production of such materials for use in electroacoustic transducer devices.

It has been found that certain polymeric materials, for example polyvinylidene fluoride (hereinafter referred to as $PVF_2$), exhibit piezoelectric properties, and that these properties can be enhanced considerably by exposing the material to treatment known as "poling". Poling involves the application to the material, whilst at an elevated temperature, of an electric field.

In practice, the material, usually in the form of a film, has electrodes applied to both faces is placed in an oven and when at the required temperature a polarising voltage is applied across the electrodes. Typically, temperatures in the range of from 100° C.–120° C. are used in conjunction with voltages in the order of one megavolt per centimeter of film thickness.

The enhanced level of piezoelectricity produced in the film is a function of the magnitude of both the treatment temperature and the applied electric field. However, the extent to which the treatment temperature can be raised is limited by the melting point of the material, whilst the extent to which the applied electric field can be increased in limited by the dielectric strength of the film. Defects in the film for example bubbles, pin holes, scratches and included foreign bodies constitute weak spots in the film and electrical breakdown of the film is liable to occur at such spots. When breakdown occurs, damage is caused to the film and to the electrodes and results sometimes in the rejection of a length of film which is thus wasted. Breakdowns are more frequent at higher applied electric fields and elevated temperatures.

Thus, although it is known that greater enhancement of piezoelectric activity is obtainable by using higher applied electric fields and elevated temperatures, it has not been possible to take full advantage of this for the reasons set out above.

According to the present invention a method of enhancing the piezoelectric properties of a polymeric material exhibiting such properties is characterised in that, before subjecting the material to a "poling" treatment, the material is exposed whilst in an atmosphere inert with respect to the material and at substantially room temperature to a quantity of gamma ($\gamma$) radiation lying within the range of from 1 Mrad to 200 Mrads (both limits included).

Specifically, the invention also provides a method of enhancing the piezoelectric activity of polyvinylidene fluoride by exposing the latter whilst in an atmosphere inert with respect thereto and at substantially room temperature to a quantity of $\gamma$ radiation lying within the range of from 1 Mrad to 200 Mrads (both limits included) after which the material is subjected to a poling treatment.

The improved enhancement of the piezoelectric properties of the material renders the material more useful in nearly all of its applications. For example, it improves the sensitivity of an electro-acoustic transducer fitted with a piezoelectric material according to the invention.

In one method embodying the invention the polyvinylidene fluoride is in the physical form of a biaxially orientated film.

The phase "in an atmosphere inert with respect to the material", or "in an atmosphere inert with respect thereto" is intended to include irradiation in a vacuum in which the air pressure does not exceed $10^{-3}$ mm Hg (0.13 N/m$^2$) as well as irradiation in an atmosphere that does not cause embrittlement of the material undergoing irradiation. It has been found that it is important to exclude oxygen from the atmosphere. An example of an inert atmosphere is a nitrogen atmosphere and this can be obtained by flushing out with nitrogen the chamber in which irradiation is to be effected to remove all air.

The quantity of $\gamma$ radiation to which the material is exposed preferably lies in the range of from 1 Mrad to 99 Mrads (both limits included). The enhancement of the piezoelectric properties of the material is particularly pronounced at these lower exposure levels.

The invention also provides a polymeric material exhibiting piezoelectric properties which have been enhanced by a method as defined above.

By way of example only, a method of enhancing the piezoelectric activity of biaxially orientated polyvinylidene fluoride film will now be described with reference to FIG. 1, the accompanying drawing, which is a schematic sectional view of a sample of the film being irradiated.

Prior to irradiation, vacuum evaporated aluminium electrodes are formed on both sides of the film using conventional techniques. Referring to FIG. 1, a strip of the film 1 having, for example, a thickness of 25 $\mu$m, a width of about 30 cm and a length of a few hundred meters, is then wound onto a reel 2 and placed in a dessicator 3, maintained at room temperature and exhausted to $10^{-5}$ mm Hg ($1.3 \times 10^{-3}$ N/m$^2$), oxygen being excluded. The dessicator is in turn placed in a concrete bunker 5 and irradiated from a source of radiation 6, for example Cobalt 60. The film 1 is exposed to a preselected quantity of radiation lying within the range of from 1 to 200 Mrads and illustrated schematically by arrows 4 in FIG. 1; the direction and intensity of radiation incident on the film depends on the position of the dessicator 3 in the bunker. After irradiation, the dessicator 3 is removed from the bunker, the reel 2 is removed from the dessicator and the film is poled by application across the electrodes of an electric field while the film is at an elevated temperature.

In the method described above, the aluminium electrodes are formed on the film before irradiation but the formation of electrodes may be deferred until after irradiation if desired.

Samples of films treated in various ways have been tested. In the tests the film was that produced by the firm Kureha Kagaku Kogyo Kabushiki Kaisha of Tokyo, Japan and is of 25 $\mu$m thickness. Prior to treatment vacuum evaporated aluminium electrodes were formed on both sides of the film using conventional techniques.

The sample was then placed in a vacuum chamber maintained at room temperature and exhausted to $10^{-5}$ mm Hg ($1.3 \times 10^{-3}$ N/m$^2$), oxygen being excluded. The chamber was then removed to a source of $\gamma$ radiation, namely Cobalt 60. After irradiation, the sample was removed. Subsequently, the sample was "poled" by application across the electrodes of an electric field while the sample was at an elevated temperature.

After poling the sample was subjected to tests to measure its piezoelectric activity. The activity was measured by stressing the sample in a direction lying along the machine or roll direction of the film.

The following table shows the piezoelectric activity of the film. The first column of the table sets out the irradiation treatment to which the portion of film was exposed, whilst the second column gives details of the "poling" treatment. Of the details given in the second column, the first figure is the poling field, the second is the poling temperature and the third is the duration of the poling treatment. The third column gives the measured value of the piezoelectric coefficient for stress applied along the machine direction.

| Irradiation Treatment | Poling Treatment | Piezoelectric voltage coefficient $g_{31}$ (Vm/N) |
|---|---|---|
| None | None | $1.8 \times 10^{-5}$ |
| None | 0.5 MV/cm, 100° C., 45 min. | $1.4 \times 10^{-2}$ |
| 200 Mrad | 0.25 MV/cm, 100° C., 45 min. | $1.2 \times 10^{-2}$ |
| 53 Mrad | 0.5 MV/cm, 100° C., 45 min. | $3.4 \times 10^{-2}$ |
| 99 Mrad | 0.5 MV/cm, 100° C., 45 min. | $2.9 \times 10^{-2}$ |
| None | 1.0 MV/cm, 100° C., 45 min. | $3.8 \times 10^{-2}$ |
| 12 Mrad | 1.0 MV/cm 100° C., 45 min. | $5.8 \times 10^{-2}$ |
| 25 Mrad | 1.0 MV/cm 100° C., 45 min. | $6.1 \times 10^{-2}$ |
| 53 Mrad | 1.0 MV/cm, 100° C., 45 min. | $6.1 \times 10^{-2}$ |
| 99 Mrad | 1.0 MV/cm, 100° C., 45 min. | $3.6 \times 10^{-2}$ |

It will be observed that there is a substantial increase in piezoelectric activity in certain of the samples as a result of the pre-poling irradiating treatment.

It will be appreciated that a given level of piezoelectric activity may be produced by employing the irradiation treatment in conjunction with a poling treatment employing lower levels of polarising potential than would be necessary to produce that level of piezoelectric activity employed without irradiation. Such a combination will enable material which would previously have been rejected as defective to be utilised.

Polymeric materials, other than polyvinylidene fluoride, which exhibit latent piezoelectricity may also be treated by processes embodying the invention. While not constituting a limitation in the scope of the invention, such other materials would importantly include copolymers of polyvinylidene fluoride, e.g. copolymer of ethylene and vinylidene fluoride, copolymer of vinylidene fluoride and tetrafluoroethylene, copolymer of vinylidene fluoride and vinyl fluoride, copolymer of vinylidene fluoride and trifluoromonochloroethylene, and the like. Also included are such halogen containing polymers as polyvinyl fluoride, polyvinyl chloride and the like.

In addition, it is not essential that the material be in film form or in the form of a biaxially orientated film.

As piezoelectrical properties are intimately linked with pyro-electrical properties, it is likely that the above described treatment will also enhance the pyro-electric coefficient of the material.

The treated material is suitable for use in microphone transmitters, receivers and pressure transducers.

What is claimed is:

1. A method of enhancing the piezoelectric voltage coefficient of a polymeric material exhibiting piezoelectric properties, the method including the step of exposing the material whilst in an atmosphere inert with respect to the material and at substantially room temperature to a quantity of $\gamma$ radiation lying within the range of from 1 Mrad to 200 Mrads (both limits included) after which the material is subjected to a poling treatment whereby the piezoelectric voltage coefficient of the material is increased over that obtained by subjecting the material without prior irradiation to said poling treatment.

2. A method according to claim 1, wherein the quantity of radiation to which the material is exposed lies in the range of from 1 Mrad to 99 Mrads (both limits included).

3. A method according to claim 1, wherein the inert atmosphere is a vacuum in which the air pressure does not exceed $10^{-3}$ mm Hg.

4. A method of enhancing the piezoelectric voltage coefficient of polyvinylidene fluoride by exposing the polyvinylidene fluoride whilst in an atmosphere inert thereto and at substantially room temperature to a quantity of $\gamma$ radiation lying within the range of from 1 Mrad to 200 Mrads (both limits included) after which the material is subjected to a poling treatment whereby the piezoelectric voltage coefficient of the material is increased over that obtained by subjecting the material without prior irradiation to said poling treatment.

5. A method according to claim 4 wherein the polyvinylidene fluoride is in the form of a biaxially orientated film.

6. A method according to claim 4, wherein the quantity of radiation to which the material is exposed lies in the range of from 1 Mrad to 99 Mrads (both limits included).

7. A method according to claim 4, wherein the inert atmosphere is a vacuum in which the air pressure does not exceed $10^{-3}$ mm Hg.

* * * * *